United States Patent
Parkhe (10) Patent No.: US 11,881,423 B2
(45) Date of Patent: Jan. 23, 2024

(54) ELECTROSTATIC CHUCK WITH METAL BOND

(71) Applicant: Applied Materials, Inc., Santa Clara, CA (US)

(72) Inventor: Vijay D. Parkhe, San Jose, CA (US)

(73) Assignee: Applied Materials, Inc., Santa Clara, CA (US)

( * ) Notice: Subject to any disclaimer, the term of this patent is extended or adjusted under 35 U.S.C. 154(b) by 335 days.

(21) Appl. No.: 17/171,916

(22) Filed: Feb. 9, 2021

(65) Prior Publication Data

US 2022/0254670 A1  Aug. 11, 2022

(51) Int. Cl.
*H01L 21/683* (2006.01)
*H01L 21/687* (2006.01)
*H01J 37/32* (2006.01)

(52) U.S. Cl.
CPC .... *H01L 21/6833* (2013.01); *H01J 37/32082* (2013.01); *H01J 37/32724* (2013.01); *H01L 21/68757* (2013.01); *H01L 21/68785* (2013.01)

(58) Field of Classification Search
CPC ........... H01L 21/6833; H01L 21/68757; H01L 21/68785; H01J 37/32724
See application file for complete search history.

(56) References Cited

U.S. PATENT DOCUMENTS

| | | | |
|---|---|---|---|
| 6,884,511 B1 | 4/2005 | Rossing et al. | |
| 8,559,159 B2 * | 10/2013 | Roy | H01L 21/6831 361/234 |
| 9,472,434 B2 | 10/2016 | Cox | |
| 2009/0235866 A1* | 9/2009 | Kataigi | H01L 21/6875 118/725 |
| 2013/0306593 A1 | 11/2013 | Hida et al. | |
| 2014/0159325 A1* | 6/2014 | Parkhe | H01L 21/67109 156/154 |
| 2014/0209245 A1* | 7/2014 | Yamamoto | H01L 21/6831 361/234 |

(Continued)

FOREIGN PATENT DOCUMENTS

| JP | 2004296579 | 10/2004 |
|---|---|---|
| JP | 2018030157 A * | 3/2018 |

(Continued)

OTHER PUBLICATIONS

International Search Report and Written Opinion from Application No. PCT/US2022/011788 dated Apr. 26, 2022, 15 pgs.

(Continued)

*Primary Examiner* — David Vu
*Assistant Examiner* — Brandon C Fox
(74) *Attorney, Agent, or Firm* — Schwabe, Williamson & Wyatt, P.C.

(57) ABSTRACT

Electrostatic chucks (ESCs) for plasma processing chambers, and methods of fabricating ESCs, are described. In an example, a substrate support assembly includes a ceramic bottom plate having heater elements therein. The substrate support assembly also includes a ceramic top plate having an electrode therein. A metal layer is between the ceramic top plate and the ceramic bottom plate. The ceramic top plate is in direct contact with the metal layer, and the metal layer is in direct contact with the ceramic bottom plate.

5 Claims, 9 Drawing Sheets

(56) References Cited

U.S. PATENT DOCUMENTS

| | | | |
|---|---|---|---|
| 2015/0077895 A1* | 3/2015 | Jindo | C04B 35/645 228/121 |
| 2016/0185935 A1* | 6/2016 | Crooks | B32B 7/027 106/204.3 |
| 2018/0108556 A1* | 4/2018 | Takebayashi | C04B 37/006 |
| 2018/0160474 A1* | 6/2018 | Criminale | H02J 3/14 |
| 2020/0031725 A1* | 1/2020 | Elliot | H01L 21/68757 |
| 2020/0075383 A1 | 3/2020 | Minemura | |
| 2020/0185249 A1 | 6/2020 | Rice et al. | |
| 2020/0206835 A1* | 7/2020 | Parker | H01L 21/68757 |
| 2021/0066222 A1* | 3/2021 | Chen | H01L 24/08 |

FOREIGN PATENT DOCUMENTS

| | | |
|---|---|---|
| JP | 6449916 B2 | 1/2019 |
| KR | 1014681840000 B1 | 12/2014 |
| KR | 1020200105367 A | 9/2020 |

OTHER PUBLICATIONS

International Preliminary Report on Patentability from PCT/US2022/011788 dated Aug. 24, 2023, 10 pgs.

\* cited by examiner

ELECTROSTATIC CHUCK WITH METAL BOND

BACKGROUND

1) Field

Embodiments of the present disclosure pertain to the field of reactor or plasma processing chambers and, in particular, to electrostatic chucks with metal bonds.

2) Description of Related Art

Processing systems such as reactors or plasma reactors are used to form devices on a substrate, such as a semiconductor wafer or a transparent substrate. Often the substrate is held to a support for processing. The substrate may be held to the support by vacuum, gravity, electrostatic forces, or by other suitable techniques. During processing, the precursor gas or gas mixture in the chamber is energized (e.g., excited) into a plasma by applying a power, such as a radio frequency (RF) power, to an electrode in the chamber from one or more power sources coupled to the electrode. The excited gas or gas mixture reacts to form a layer of material on a surface of the substrate. The layer may be, for example, a passivation layer, a gate insulator, a buffer layer, and/or an etch stop layer.

In the semiconductor and other industries, electrostatic chucks (ESC) are used to hold a workpiece such as substrates on supports during processing of the substrate. A typical ESC may include a base, an electrically insulative layer disposed on the base, and one or more electrodes embedded in the electrically insulative layer. The ESC may be provided with an embedded electric heater, as well as be fluidly coupled to a source of heat transfer gas for controlling substrate temperature during processing. During use, the ESC is secured to the support in a process chamber. The electrode in the ESC is electrically biased with respect to a substrate disposed on the ESC by an electrical voltage source. Opposing electrostatic charges accumulate in the electrode of the ESC and on the surface of the substrate, the insulative layer precluding flow of charge there between. The electrostatic force resulting from the accumulation of electrostatic charge holds the substrate to the ESC during processing of the substrate.

SUMMARY

Embodiments of the present disclosure include electrostatic chucks (ESCs) for plasma processing chambers, and methods of fabricating ESCs.

In an embodiment, a substrate support assembly includes a ceramic bottom plate having heater elements therein. The substrate support assembly also includes a ceramic top plate having an electrode therein. A metal layer is between the ceramic top plate and the ceramic bottom plate. The ceramic top plate is in direct contact with the metal layer, and the metal layer is in direct contact with the ceramic bottom plate.

In another embodiment, method of fabricating a substrate support assembly includes forming a ceramic bottom plate having heater elements therein. The method also includes forming a ceramic top plate having an electrode therein. The method also includes bonding the ceramic top plate to the ceramic bottom plate with a metal layer between the ceramic top plate and the ceramic bottom plate. The ceramic top plate is in direct contact with the metal layer, and the metal layer is in direct contact with the ceramic bottom plate.

In another embodiment, system for deposition includes a chamber, a plasma source within or coupled to the chamber, and an electrostatic chuck within the chamber. The electrostatic chuck includes a ceramic bottom plate having heater elements therein. The substrate support assembly also includes a ceramic top plate having an electrode therein. A metal layer is between the ceramic top plate and the ceramic bottom plate. The ceramic top plate is in direct contact with the metal layer, and the metal layer is in direct contact with the ceramic bottom plate.

DETAILED DESCRIPTION

Electrostatic chucks (ESCs) for plasma processing chambers, and methods of fabricating ESCs, are described. In the following description, numerous specific details are set forth, such as electrostatic chuck components and material regimes, in order to provide a thorough understanding of embodiments of the present disclosure. It will be apparent to one skilled in the art that embodiments of the present disclosure may be practiced without these specific details. In other instances, well-known aspects, such as plasma enhanced chemical vapor deposition (PECVD) or plasma enhanced atomic layer deposition (PEALD) processes, are not described in detail in order to not unnecessarily obscure embodiments of the present disclosure. Furthermore, it is to be understood that the various embodiments shown in the Figures are illustrative representations and are not necessarily drawn to scale.

One or more embodiments are directed to new approaches for fabricating ESCs without affecting resistivity of the ESC. Embodiments can be implemented to fabricate an ESC without an associated resistivity change.

To provide context, generally, diffusion bonding is a costly process and heating to such high temperatures affects thermal and or electrical properties of ceramics. State-of-the-art ESCs are typically fabricated with two diffusion bonds: one diffusion bond between a top plate and a bottom plate, and a second diffusion bond between the bonded plates and a shaft. It is to be appreciated that the use of too many diffusion bonds formed at high temperature can affect ceramic resistivity. Embodiments described herein can be implemented to eliminate the need for diffusion bonding, or at least limit the number of diffusion bonds in an ESC to one diffusion bond. Embodiments can be implemented to ensure that a top plate does not change (or only minimally changes) resistivity during fabrication of an ESC. Embodiments may be implemented to advantageously reduce the cost of ESC fabrication since at least one high temperature operation is removed from the fabrication scheme. Embodiments can be implemented to preserve or retain an as-sintered resistivity of a top ceramic material.

Advantages to implementing one or more embodiments described herein can include enabling fabrication of an ESC without resistivity change. Advantages can include reduced fabrication cost for an ESC. Advantages can include enabling the possibility of fabricating an ESCs to maintain the electrical properties of the components included in the ESC.

In comparison to state-of-the-art approaches which can include two diffusion bonds, in accordance with an embodiment of the present disclosure, an aluminum bond is used in place of a typical diffusion bond (or organic bond). For example, an aluminum bond can be used between a top plate and a bottom plate, between a bottom plate and a shaft, or both between a top plate and a bottom plate and between a bottom plate and a shaft; All 3 top middle and shaft are aluminum bonded.

In accordance with one or more embodiments of the present disclosure, manufacturing operations for fabricating an ESC without losing good electrical properties can include: (1) fabricating a top ESC plate with brazed high voltage connection(s), (2) fabricating a bottom plate with heater(s), (3) fabricating a shaft, (4) diffusion bonding the shaft to the bottom plate, (5) brazing electrical connections to the bottom plate, (6) metal (e.g., aluminum) bonding the top plate to bottom plate, and (7) installation of insulation tubes. It is to be appreciated that the above listing of operations may be performed in the order presented, or may be performed in a different order. It is also to be appreciated that it may be the case that not all operations are performed and/or that additional operations than those listed above may be performed.

Figure 1:
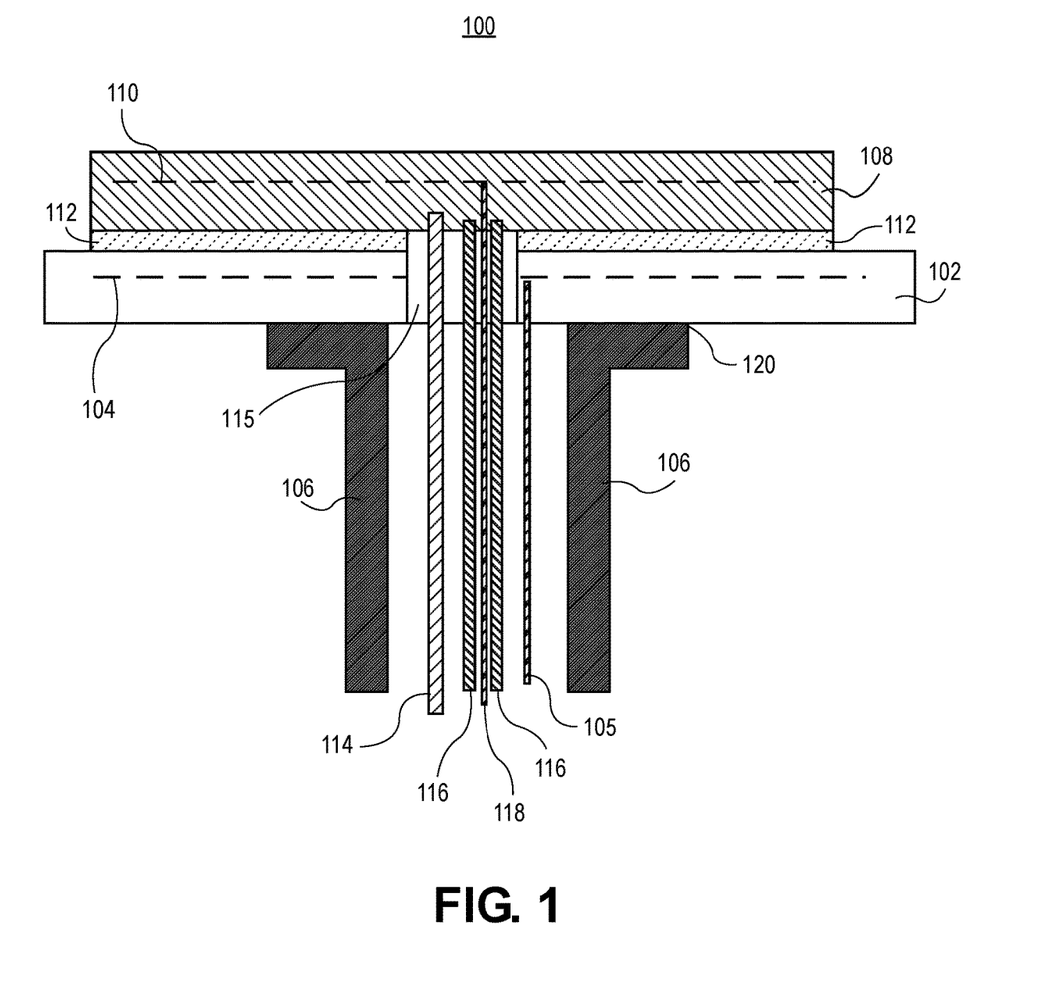
FIG. 1 illustrates a cross-sectional view of an electrostatic chuck (ESC), in accordance with an embodiment of the present disclosure.

As an exemplary fabricated ESC, FIG. 1 illustrates a cross-sectional view of an electrostatic chuck (ESC), in accordance with an embodiment of the present disclosure.

Referring to FIG. 1, an ESC 100 includes a ceramic bottom plate 102 having heater coils 104 therein. The heater coils 104 can be coupled to a heater connection 105 (it is to be appreciated that in another embodiment, a heater electrode is screen printed in case of tape casted AlN or AlN plate material used for the ESC fabrication). A ceramic shaft 106 is bonded to a bottom surface of the ceramic bottom plate 102. The ESC 100 also includes a ceramic top plate 108. The ceramic top plate 108 has an ESC (clamping) electrode 110 or electrode assembly therein. A metal layer 112 bonds the ceramic top plate 108 to a top surface of the ceramic bottom plate 102. A thermocouple 114 extends through an opening 115 in the ceramic bottom plate 102 and in metal layer 112. A high voltage insulation 116 extends through the opening 115 in the ceramic bottom plate 102 and in metal layer 112 and houses an ESC high voltage connection 118.

With reference again to FIG. 1, in accordance with an embodiment of the present disclosure, a substrate support assembly 100 includes a ceramic bottom plate 102 having heater elements 104 therein. The substrate support assembly 100 also includes a ceramic top plate 108 having an electrode 110 therein. A metal layer 112 is between the ceramic top plate 108 and the ceramic bottom plate 102. The ceramic top plate 108 is in direct contact with the metal layer 112, and the metal layer 112 is in direct contact with the ceramic bottom plate 102.

In other embodiments, a ceramic top plate and a ceramic bottom plate are bonded under 1400 degrees Celsius using metal, alloys of metal or ceramic glue after a ceramic shaft is diffusion bonded to the ceramic bottom plate. In other embodiments, metal, alloy or ceramic bonding materials are used to join top plate, bottom plate and shaft parts.

In an embodiment, metal layer 112 provides for the incorporation of a metal bond in place of a ceramic to ceramic diffusion bond that can otherwise change a resistivity of a top ceramic during diffusion bond formation. In one embodiment, metal layer 112 is a metal foil, such as an aluminum foil. In one such embodiment, metal layer 112 is an aluminum foil impregnated with about 2% to 20% Si (e.g., as atomic % of total foil composition), with the remainder being aluminum or essentially all aluminum (i.e., the aluminum foil includes silicon having an atomic concentration in the range of 2%-20% of the aluminum foil). In an embodiment, metal layer 112 is pre-patterned, e.g., to include opening 115 and/or additional openings to accommodate lift pins, etc. In one embodiment, the metal layer 112 is an aluminum foil having a thickness in the range of 50-500 microns, and may be about 250 microns. In an embodiment, the metal layer 112 is an aluminum foil and is cleaned prior to inclusion in an ESC manufacturing process, e.g., to remove a passivation layer prior to bonding. In an embodiment, metal layer 112 is an aluminum foil and can sustain corrosive processes such as chlorine based process without etch or degradation of the metal layer 112 when the ESC is in use. However, if used for non-chlorine based processes, metal layer 112 may be composed of silver copper alloy, with or without addition of titanium, for example. In an embodiment, metal layer 112 is bonded to top plate 108 and bottom plate 102 at a temperature less than 600 degrees Celsius and, more particularly, less than 300 degrees Celsius. It is to be appreciated that higher ESC usage temperatures such as 650 degrees Celsius can be used if metal bonding is performed with a high temperature metal bond such as silver copper or gold nickel temperatures much lower than 1400 degrees Celsius but much above a 650 degrees Celsius usage temperature.

In an embodiment, a bond 120 between the ceramic shaft 106 and the ceramic bottom plate 102 is a diffusion bond formed from ceramic to ceramic bonding. In other embodiments, the bond 120 is an inorganic bond or an organic bond, and the ceramic shaft 106 is attached to the ceramic bottom plate 102 by any suitable technique such as gluing, use of mechanical fasteners, brazing, welding, etc. However, in accordance with an embodiment of the present disclosure, bond 120 is alternatively a metal bond, such as a bond formed by including a metal layer (similar to layer 112) between the ceramic shaft 106 and the ceramic bottom plate 102, an example of which is described in association with FIG. 3A.

With reference to ceramic top plate 108 having the ESC (clamping) electrode 110 therein, in an embodiment, a body of the top plate may be formed by sintering a ceramic material, such as aluminum nitride (AlN) or aluminum oxide powder or other suitable material. An RF mesh can be is embedded in the body. The RF mesh can have electrical connections extending through a bottom surface of the body.

The RF mesh may include molybdenum or another suitable metal material mesh. In one embodiment, the mesh is an about 125 micron diameter mesh. The materials can be sintered to form a unitary structure. In one embodiment, the electrode 110 is fabricated from a metallic material, for example molybdenum, which may have a coefficient of thermal expansion similar to the body. In an embodiment, the ceramic top plate 108 is targeted for sustaining temperatures below 350 degrees Celsius, e.g., between 150-300 degrees Celsius, and may include dopants for optimizing such a targeted temperature range operation.

A clamping electrode 110 can include at least first and second electrodes. During operation, a negative charge may be applied to the first electrode and a positive charge may be applied to the second electrode, or vice versa, to generate an electrostatic force. During chucking, the electrostatic force generated from the electrodes holds a substrate disposed thereon in a secured position. As a power supplied from a power source is turned off, the charges present in an interface between the electrodes may be maintained over a long period of time. To release the substrate held on the electrostatic chuck, a short pulse of power in the opposite polarity may be provided to the electrodes to remove the charge present in the interface.

An electrode assembly may be formed by metallic bars, sheet, sticks, foil, and may be pre-molded, pre-casted and pre-manufactured and placed onto a surface of an insulating base during fabrication of the electrostatic chuck. Alternatively, a metal deposition process may be performed to deposit and form the electrode assembly directly on a top surface of an insulating base. Suitable deposition process may include PVD, CVD, plating, ink jet printing, rubber stamping, screen printing or aerosol print process. Additionally, metal paste/metal lines may be formed on a top surface of an insulating base. The metal paste/metal lines may initially be a liquid, paste or metal gel that may be patterned on to the object surface in a pattern to form electrode fingers with different configurations or dimensions on the top surface of the insulating base.

With reference to ceramic bottom plate 102, in an embodiment, the ceramic bottom plate 102 is targeted for sustaining temperatures up to 650 degrees Celsius, and may include dopants for optimizing such a targeted temperature range operation. In one embodiment, the ceramic bottom plate 102 has a different aluminum nitride composition than an aluminum nitride composition of the ceramic top plate 108. Heating elements 104 included in the ceramic bottom plate 102 may use any suitable heating techniques, such as resistive heating or inductive heating. The heating elements 104 may be composed of a resistive metal, a resistive metal alloy, or a combination of the two. Suitable materials for the heating elements may include those with high thermal resistance, such as tungsten, molybdenum, titanium, or the like. In one embodiment, heating elements 104 are composed of a molybdenum wire. The heating elements 104 may also be fabricated with a material having thermal properties, e.g., coefficient of thermal expansion, substantially matching at least one or both the aluminum nitride body to reduce stress caused by mismatched thermal expansion.

Ceramic shaft 106 can include a material having thermal properties, e.g., coefficient of thermal expansion, that substantially match that of the ceramic bottom plate 102. Ceramic material suitable for fabricating the shaft 106 may include, but is not limited to, aluminum nitride, glass, silicon carbide, aluminum oxide, yttrium containing materials, yttrium oxide ($Y_2O_3$), yttrium-aluminum-garnet (YAG), titanium oxide ($TiO_2$), or titanium nitride (TiN). A bonding process can be performed to fuse the ceramic shaft 106 and the ceramic bottom plate 102 together as a whole, thereby forming an integral component of the electrostatic chuck. It is noted that different types of bonding processes may be utilized, such as, but not limited to annealing, sintering, adhering, slumping or diffusion bonding. In one example, the bonding process is an annealing process. The annealing process may be performed by any suitable curing or annealing tool, such as oven, furnace, thermal plate, rapid thermal processing (RTP) chamber, spike anneal, or laser annealing chamber, and the like. The annealing process may be performed at a temperature between about 1200 degrees Celsius and about 2500 degree Celsius to assist the consolidation to form an integral part.

Figure 2A:
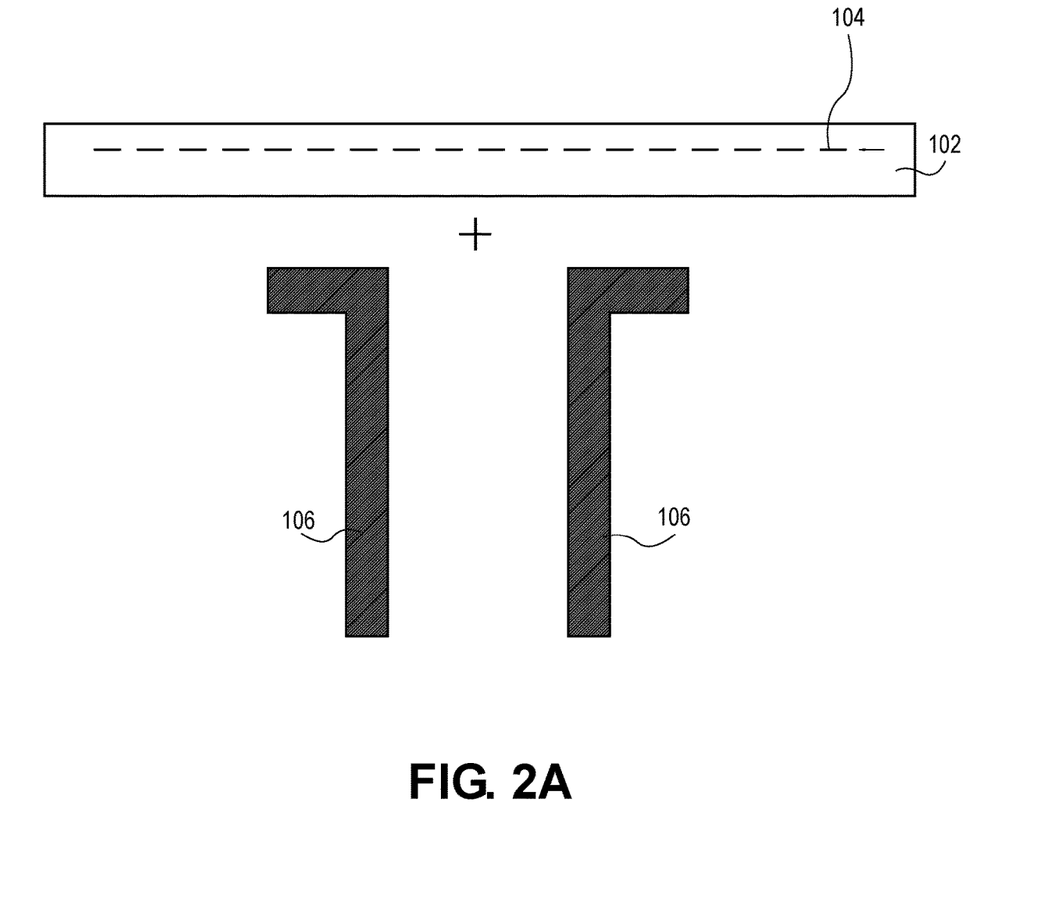
FIGS. 2A-2C illustrate cross-sectional views representing various operation in a method of fabricating an electrostatic chuck (ESC), in accordance with an embodiment of the present disclosure.
Figure 2B:
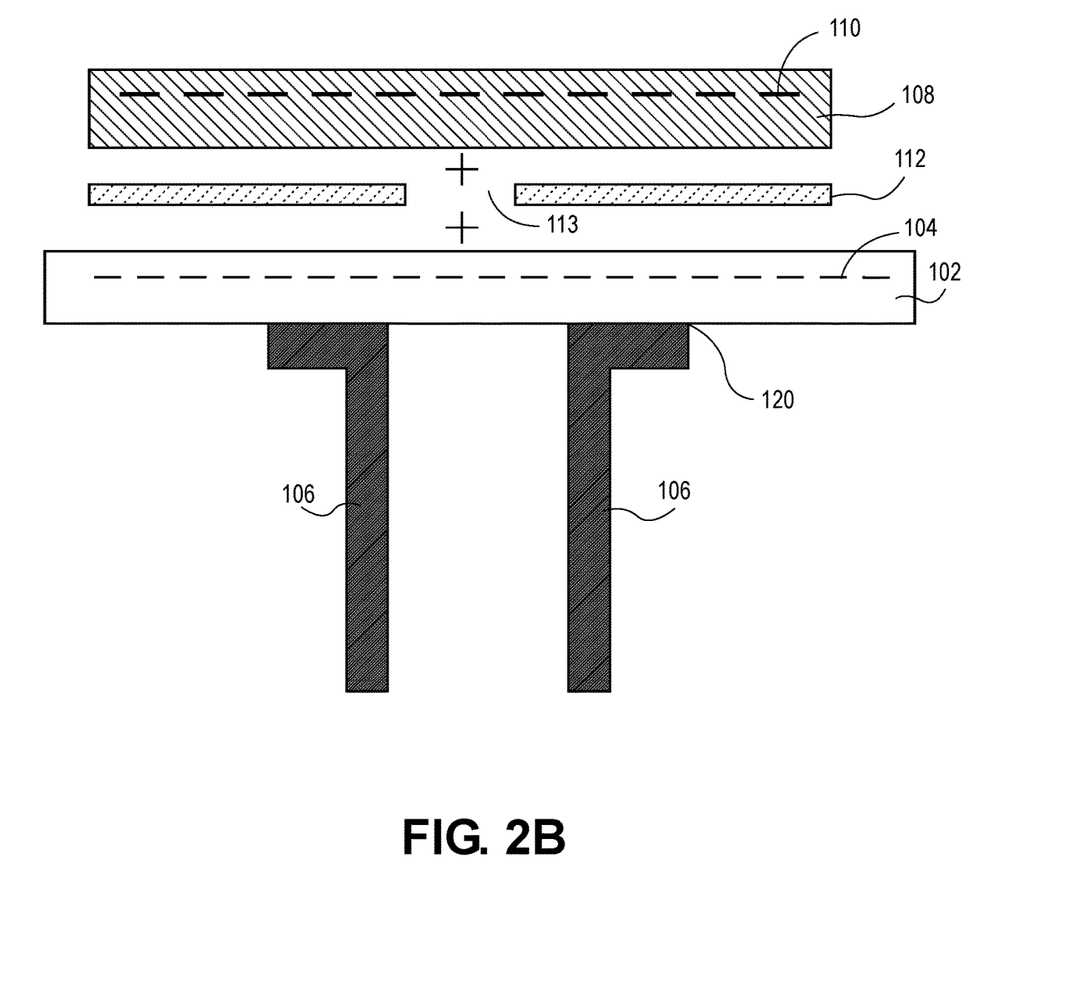
Figure 2C:
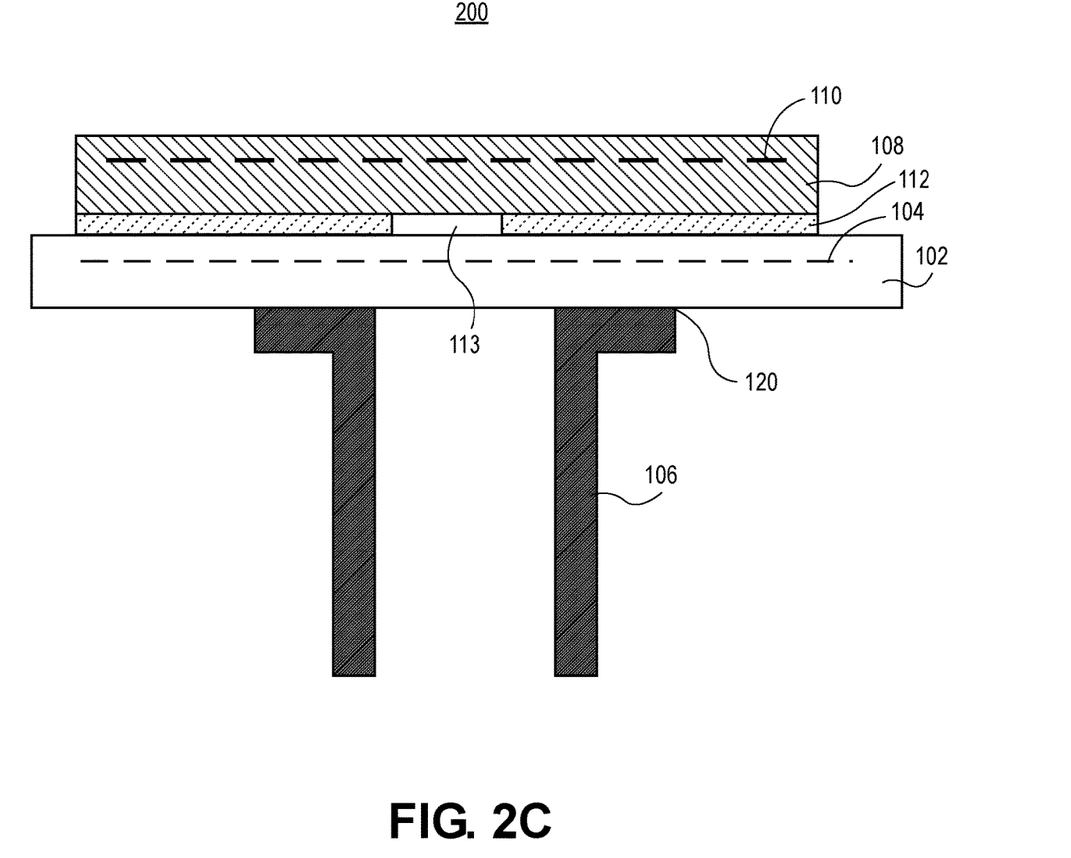

In another aspect, FIGS. 2A-2C illustrate cross-sectional views representing various operation in a method of fabricating an electrostatic chuck (ESC), in accordance with an embodiment of the present disclosure. It is to be appreciated that the order of fabrication operations is exemplary and for illustrative purposes only, and that other orders of fabrication operations may be implemented.

Referring to FIG. 2A, a ceramic shaft 106 is bonded to a ceramic bottom plate 102. In one embodiment, the ceramic bottom plate is formed from aluminum nitride (AlN) powder and a metal coil which are sintered. A bond between the shaft and the bottom plate is formed as a diffusion bond and is formed at a temperature greater than 1400 degrees Celsius. The ceramic bottom plate 102 can be solid at this stage (as is shown) or can already have an opening patterned there in (e.g., such as for central high voltage (HV) and thermocouple connections and/or lift pins, etc). It is also to be appreciated that the ceramic top plate may include other features, such as top grooves (or channels) for accommodating cooling gas flow which match through passage for gas in bond layer and top ceramic so gas is delivered behind wafer or for edge purge (e.g., as described below in association with FIG. 3B).

Referring to FIGS. 2B and 2C, a ceramic top plate 108 is fabricated and then bonded to the ceramic bottom plate by the metal layer 112 (which may already include one or more openings 113 patterned therein). In an embodiment, the metal layer 112 bonded to the ceramic top plate 108 at the same time as the metal layer 112 is bonded to ceramic bottom plate 102. In another embodiment, the metal layer 112 is first bonded to the ceramic top plate 108 and then the ceramic top plate/metal layer 112 pairing is bonded to ceramic bottom plate 102. In another embodiment, the metal layer 112 is first bonded to the ceramic bottom plate 102 and then the ceramic bottom plate/metal layer 112 pairing is bonded to ceramic top plate 108. In any case, in one embodiment, the ceramic top plate is formed from aluminum nitride (AlN) powder and a metal mesh which are sintered.

In an embodiment, in the case that an opening has not been pre-formed in ceramic bottom plate 102, an opening may be fabricated subsequent to the operation of FIGS. 2B and 2C. In an embodiment, connection to the top plate (e.g., thermocouple, HV connections) can be first coupled to the top plate, or may be coupled afterwards. In one embodiment, such connection are made by brazing to the ceramic top plate prior to bonding the ceramic top plate to the ceramic bottom plate.

With reference again to FIGS. 1 and 2A-2C, in accordance with an embodiment of the present disclosure, a method of fabricating a substrate support assembly 100 or 200 includes forming a ceramic bottom plate 102 having heater elements 104 therein. The method also includes forming a ceramic top plate 108 having an electrode 110 therein. The method also includes bonding the ceramic top plate 108 to the ceramic bottom plate 102 with a metal layer 112 between the ceramic top plate 108 and the ceramic bottom plate 102. The ceramic top plate 108 is in direct contact with the metal layer 112, and the metal layer 112 is in direct contact with the ceramic bottom plate 102.

In an embodiment, bonding the ceramic top plate 108 to the ceramic bottom plate 102 with the metal layer 112 includes heating the ceramic bottom plate 102, the metal layer 112, and the ceramic top plate 108 to a temperature less than 600 degrees Celsius. In an embodiment, the metal layer 112 is an aluminum foil, and the method includes cleaning a surface of the aluminum foil to remove a passivation layer of the aluminum foil prior to bonding the ceramic top plate 108 to the ceramic bottom plate 102 with the metal layer 112.

In an embodiment, the method further includes, prior to bonding the ceramic top plate 108 to the ceramic bottom plate 102 with the metal layer, bonding a ceramic shaft 106 to the ceramic bottom plate 102 at a side of the ceramic bottom plate 102 opposite the metal layer 112. In one such embodiment, bonding the ceramic shaft 106 to the ceramic bottom plate 102 includes heating the ceramic shaft 106 and the ceramic bottom plate 102 to a temperature above 1400 degrees Celsius to form a diffusion bond between the ceramic shaft 106 and the ceramic bottom plate 102.

In another embodiment, bonding the ceramic shaft 106 to the ceramic bottom plate 102 includes coupling the ceramic shaft 106 to the ceramic bottom plate 102 by a second metal layer. The ceramic bottom plate 102 is in direct contact with the second metal layer, and the second metal layer in direct contact with the ceramic shaft 106. As an example, FIG. 3A illustrates a cross-sectional view of another electrostatic chuck (ESC), in accordance with another embodiment of the present disclosure.

Figure 3A:
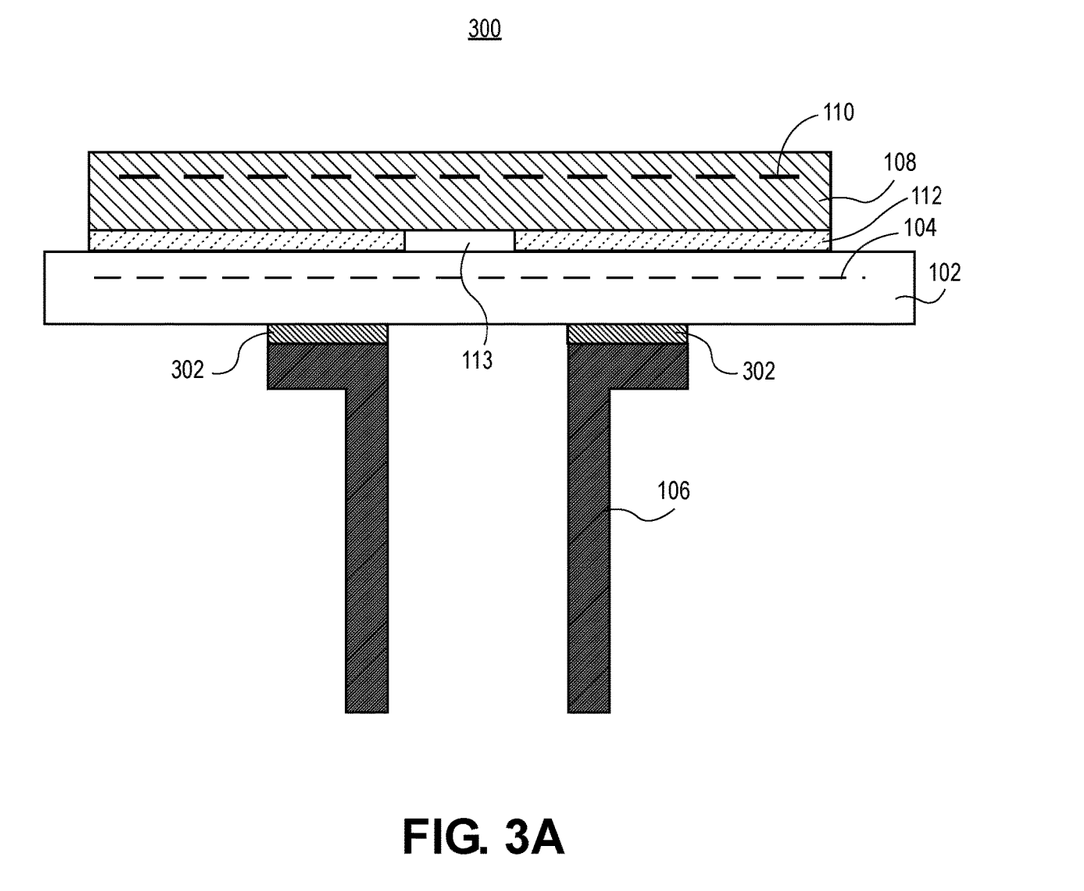
FIG. 3A illustrates a cross-sectional view of another electrostatic chuck (ESC), in accordance with another embodiment of the present disclosure.

Referring to FIG. 3A, an ESC 300 includes features similar to those described above in association with ESC 100 (where like numerals represent the same or similar feature). However, as compared to ESC 100, ESC 300 includes a second metal layer 302 between the ceramic shaft 106 and the ceramic bottom plate 102. In one embodiment, metal layer 302 has properties similar to or the same as described above for metal layer 112. It is to be appreciated that although shown without an opening yet formed, ceramic bottom plate 102 can include an opening therein aligned at the time of alignment with opening 113.

In an embodiment, metal layer 302 is used to bond ceramic shaft 106 to ceramic bottom plate 102 prior to using metal layer 112 to bond ceramic top plate 108 to ceramic bottom plate 102. In another embodiment, metal layer 302 is used to bond ceramic shaft 106 to ceramic bottom plate 102 subsequent to using metal layer 112 to bond ceramic top plate 108 to ceramic bottom plate 102. In another embodiment, metal layer 302 is used to bond ceramic shaft 106 to ceramic bottom plate 102 at the same time as using metal layer 112 to bond ceramic top plate 108 to ceramic bottom plate 102. In an alternative embodiment, an ESC is fabricated using metal layer 302 but not using metal layer 112.

Figure 3B:
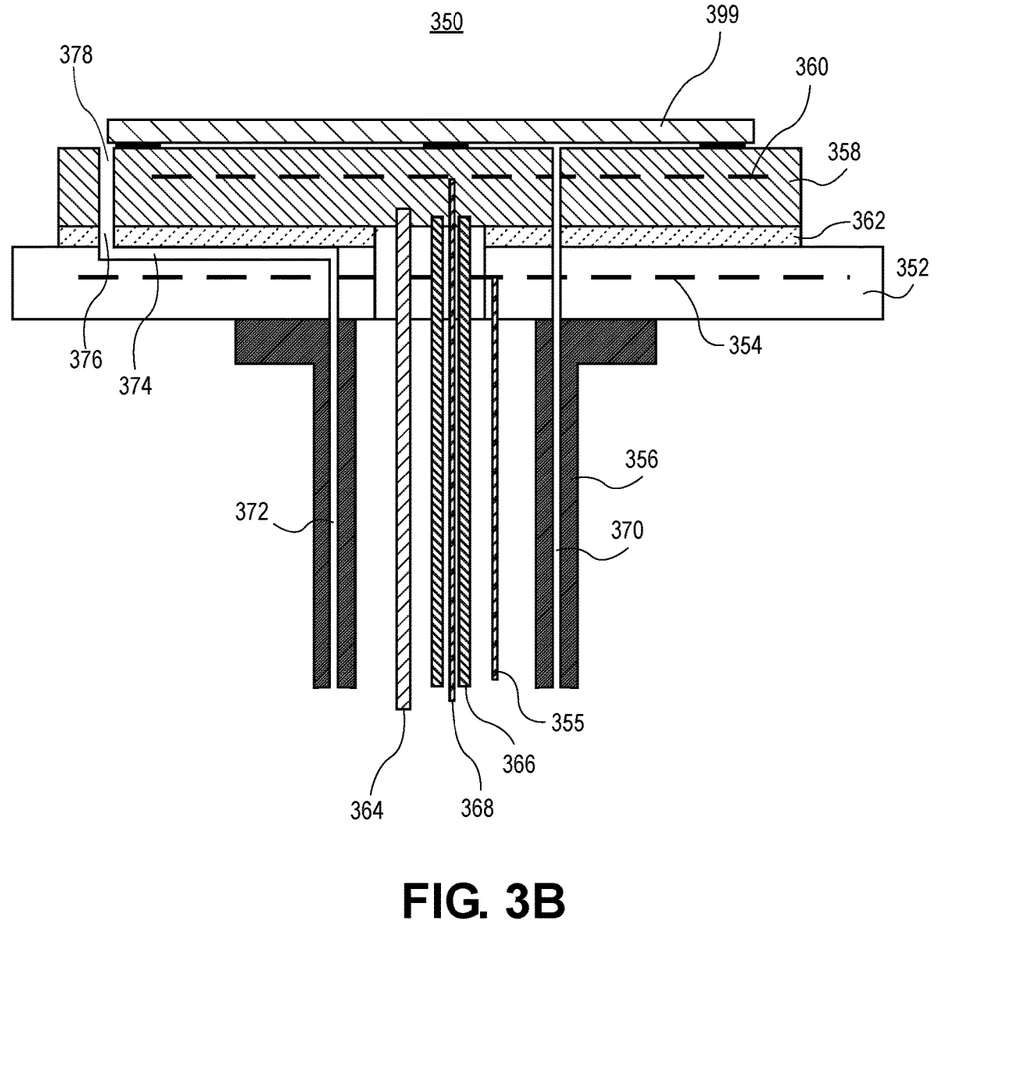
FIG. 3B illustrates a cross-sectional view of another electrostatic chuck (ESC), in accordance with another embodiment of the present disclosure.

As another exemplary fabricated ESC, FIG. 3B illustrates a cross-sectional view of another electrostatic chuck (ESC), in accordance with another embodiment of the present disclosure.

Referring to FIG. 3B, an ESC 350 for supporting a substrate 399 includes a ceramic bottom plate 352 having heater coils 354 therein. The heater coils 354 can be coupled to a heater connection 355 (it is to be appreciated that in another embodiment, a heater electrode is screen printed in case of tape casted AlN or AlN plate material used for the ESC fabrication). A ceramic shaft 356 is bonded to a bottom surface of the ceramic bottom plate 352. The ESC 350 also includes a ceramic top plate 358. The ceramic top plate 358 has an ESC (clamping) electrode 360 or electrode assembly therein. A metal layer 362 bonds the ceramic top plate 358 to a top surface of the ceramic bottom plate 352. A thermocouple 364 extends through an opening in the ceramic bottom plate 352 and in metal layer 362. A high voltage insulation 366 extends through the opening in the ceramic bottom plate 352 and in metal layer 362 and houses an ESC high voltage connection 368.

With reference again to FIG. 3B, in an embodiment, ESC 350 includes a gas pathway 370 through the ceramic shaft 356, through the ceramic bottom plate 352, through the metal layer 362, and through the ceramic top plate 358. In one embodiment, the gas pathway 370 is for heat transfer in a location between the substrate 399 and the ceramic top plate 358. In an embodiment, ESC 350 includes an opening 372 through ceramic shaft 356, a groove 374 in the top surface of the ceramic bottom plate 352, an opening 376 in metal layer 362, and an opening 378 in the ceramic top plate 358. In one embodiment, a pathway including opening 372, groove 374, and opening 378 provides a gas pathway for an edge purge to block deposition outside of the substrate 399.

Figure 4:
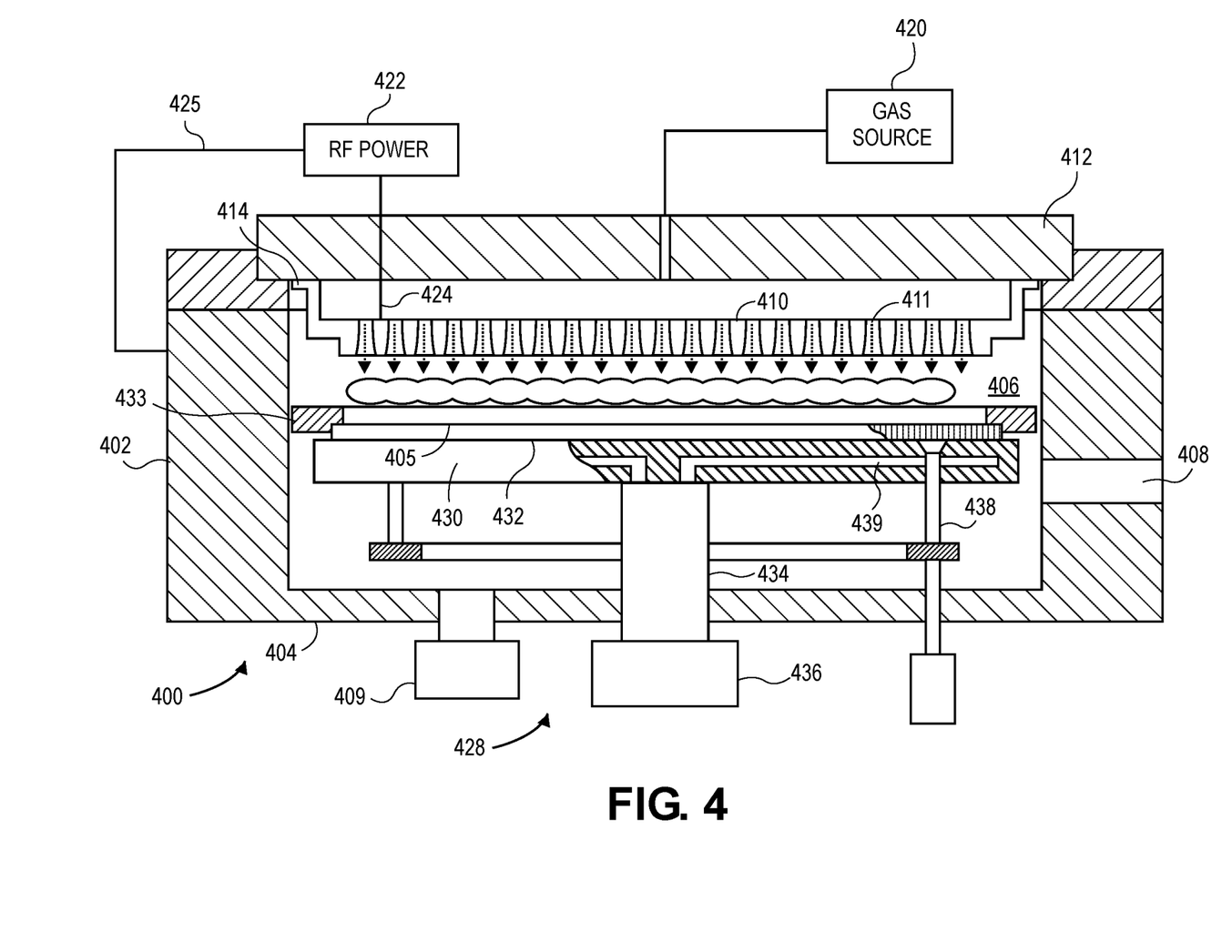
FIG. 4 is a schematic cross-sectional view of a process chamber including a substrate support assembly, in accordance with an embodiment of the present disclosure.

In another aspect, FIG. 4 is a schematic cross-sectional view of a process chamber 400 including a substrate support assembly 428, in accordance with an embodiment of the present disclosure. In the example of FIG. 4, the process chamber 400 is a plasma enhanced chemical vapor deposition (PECVD) chamber. As shown in FIG. 4, the process chamber 400 includes one or more sidewalls 402, a bottom 404, a gas distribution plate 410, and a cover plate 412. The sidewalls 402, bottom 404, and cover plate 412, collectively define a processing volume 406. The gas distribution plate 410 and substrate support assembly 428 are disposed in the processing volume 406. The processing volume 406 is accessed through a sealable slit valve opening 408 formed through the sidewalls 402 such that a substrate 405 may be transferred in and out of the process chamber 400. A vacuum pump 409 is coupled to the chamber 400 to control the pressure within the processing volume 406.

The gas distribution plate 410 is coupled to the cover plate 412 at its periphery. A gas source 420 is coupled to the cover plate 412 to provide one or more gases through the cover plate 412 to a plurality of gas passages 411 formed in the cover plate 412. The gases flow through the gas passages 411 and into the processing volume 406 toward the substrate receiving surface 432.

An RF power source 422 is coupled to the cover plate 412 and/or directly to the gas distribution plate 410 by an RF power feed 424 to provide RF power to the gas distribution plate 410. Various RF frequencies may be used. For example, the frequency may be between about 0.3 MHz and about 200 MHz, such as about 13.56 MHz. An RF return path 425 couples the substrate support assembly 428 through the sidewall 402 to the RF power source 422. The RF power source 422 generates an electric field between the gas distribution plate 410 and the substrate support assembly 428. The electric field forms a plasma from the gases present between the gas distribution plate 410 and the substrate support assembly 428. The RF return path 425 completes the electrical circuit for the RF energy prevents stray plasma from causing RF arcing due to a voltage differential between the substrate support assembly 428 and the sidewall 402.

Thus the RF return path 425 mitigates arcing which causes process drift, particle contamination and damage to chamber components.

The substrate support assembly 428 includes a substrate support 430 and a stem 434. The stem 434 is coupled to a lift system 436 that is adapted to raise and lower the substrate support assembly 428. The substrate support 430 includes a substrate receiving surface 432 for supporting the substrate 405 during processing. Lift pins 438 are moveably disposed through the substrate support 430 to move the substrate 405 to and from the substrate receiving surface 432 to facilitate substrate transfer. An actuator 414 is utilized to extend and retract the lift pins 438. A ring assembly 433 may be placed over periphery of the substrate 405 during processing. The ring assembly 433 is configured to prevent or reduce unwanted deposition from occurring on surfaces of the substrate support 430 that are not covered by the substrate 405 during processing.

The substrate support 430 may also include heating and/or cooling elements 439 to maintain the substrate support 430 and substrate 405 positioned thereon at a desired temperature. In one embodiment, the heating and/or cooling elements 439 may be utilized to maintain the temperature of the substrate support 430 and substrate 405 disposed thereon during processing to less than about 800 degrees Celsius or less. In one embodiment, the heating and/or cooling elements 439 may be used to control the substrate temperature to less than 650 degrees Celsius, such as between 300 degrees Celsius and about 400 degrees Celsius. In an embodiment, the substrate support 430/substrate support assembly 428 is as described above in association with FIGS. 1, 2A-2C and 3.

Figure 5:
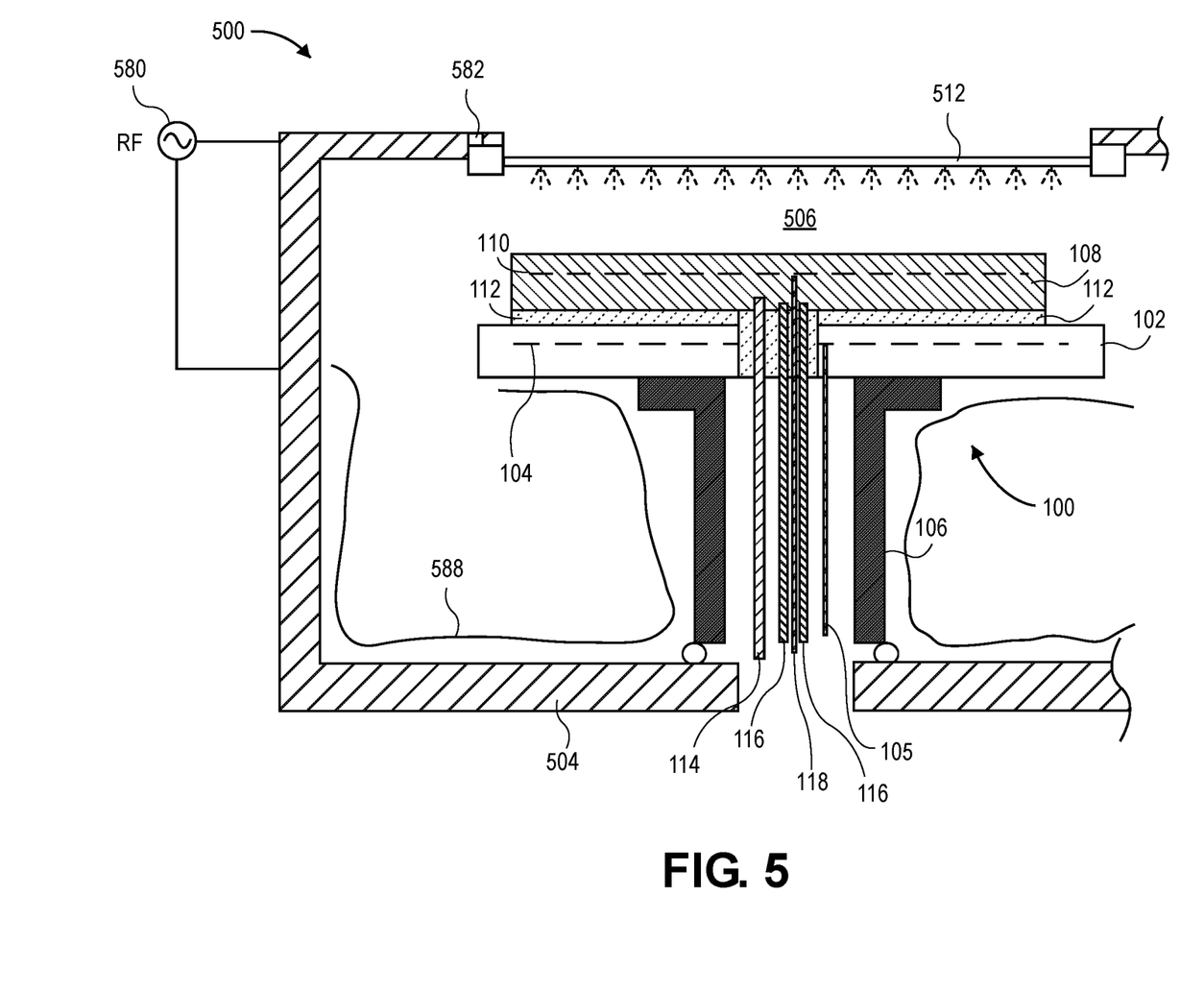
FIG. 5 is a partial schematic cross-sectional view of a processing chamber including the substrate support assembly, in accordance with an embodiment of the present disclosure.

In another aspect, FIG. 5 is a partial schematic cross-sectional view of a processing chamber 500 including the substrate support assembly 100, in accordance with an embodiment of the present disclosure. The processing chamber 500 has a body. The body has sidewalls, a bottom 504 and a showerhead 512. The sidewalls, bottom 504 and showerhead 512 define an interior volume 506. In an embodiment, a substrate support assembly 100, such as described in association with FIG. 1, 2A-2C, 3A or 3B, is disposed within the interior volume 506. A RF generator 580 may be coupled an electrode 582 in the showerhead 512. The RF generator 580 may have an associated RF return path 588 for completing the RF circuit when plasma is present. Advantageously, an RF ground path for maintaining the plasma can be maintained and provide a long service life for the substrate support assembly 100.

In an embodiment, a semiconductor wafer or substrate supported by substrate support assembly 100 is composed of a material suitable to withstand a fabrication process and upon which semiconductor processing layers may suitably be disposed. For example, in one embodiment, a semiconductor wafer or substrate is composed of a group IV-based material such as, but not limited to, crystalline silicon, germanium or silicon/germanium. In a specific embodiment, the semiconductor wafer includes is a monocrystalline silicon substrate. In a particular embodiment, the monocrystalline silicon substrate is doped with impurity atoms. In another embodiment, the semiconductor wafer or substrate is composed of a III-V material.

Embodiments of the present disclosure may be provided as a computer program product, or software, that may include a machine-readable medium having stored thereon instructions, which may be used to program a computer system (or other electronic devices) to perform a process according to embodiments of the present disclosure. In one embodiment, the computer system is coupled with process chamber 400 and substrate support assembly 428 described above in association with FIG. 4 or with processing chamber 500 and substrate support assembly 100 described in association with FIG. 5. A machine-readable medium includes any mechanism for storing or transmitting information in a form readable by a machine (e.g., a computer). For example, a machine-readable (e.g., computer-readable) medium includes a machine (e.g., a computer) readable storage medium (e.g., read only memory ("ROM"), random access memory ("RAM"), magnetic disk storage media, optical storage media, flash memory devices, etc.), a machine (e.g., computer) readable transmission medium (electrical, optical, acoustical or other form of propagated signals (e.g., infrared signals, digital signals, etc.)), etc.

Figure 6:
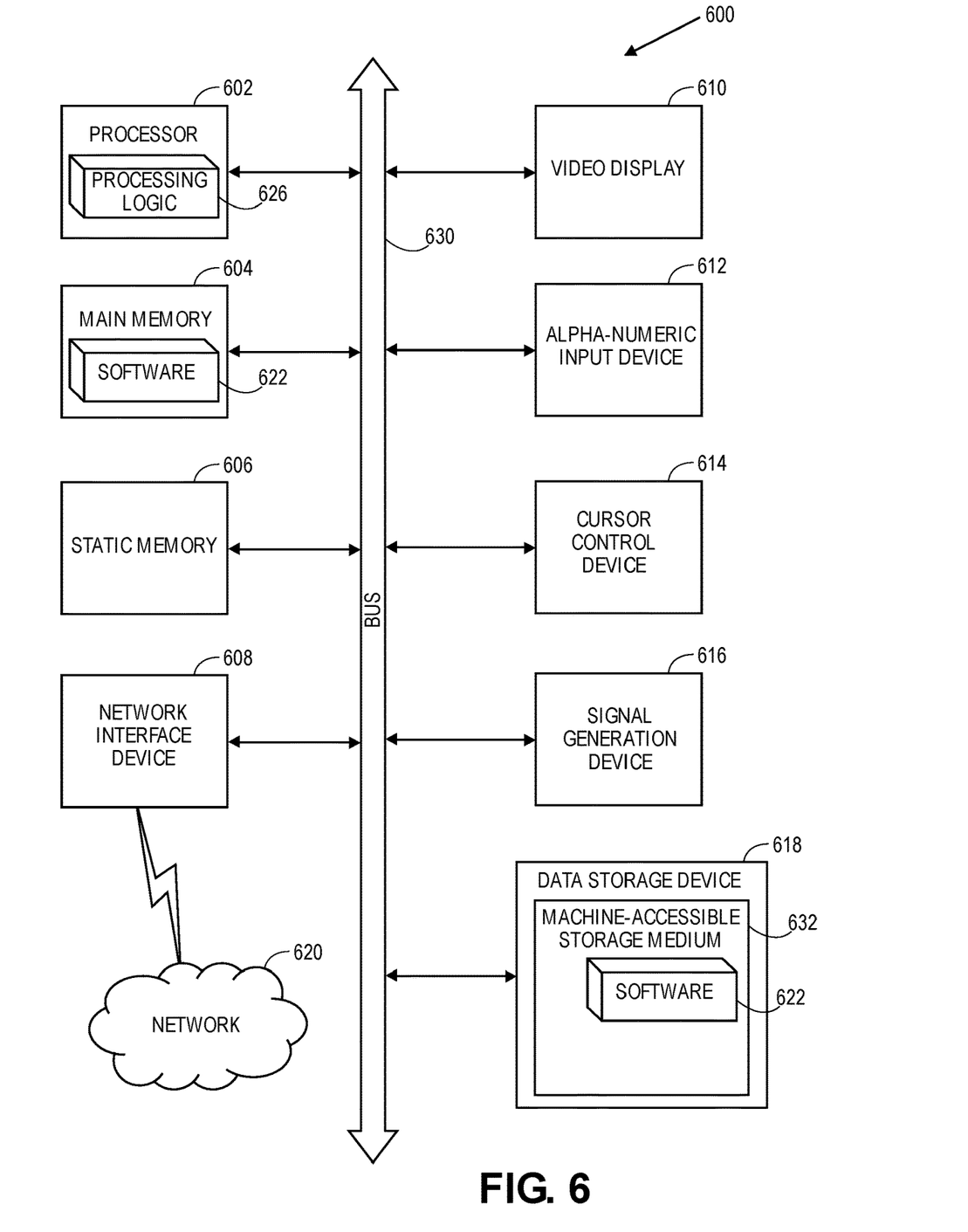
FIG. 6 illustrates a block diagram of an exemplary computer system, in accordance with an embodiment of the present disclosure.

FIG. 6 illustrates a diagrammatic representation of a machine in the exemplary form of a computer system 600 within which a set of instructions, for causing the machine to perform any one or more of the methodologies described herein, may be executed. In alternative embodiments, the machine may be connected (e.g., networked) to other machines in a Local Area Network (LAN), an intranet, an extranet, or the Internet. The machine may operate in the capacity of a server or a client machine in a client-server network environment, or as a peer machine in a peer-to-peer (or distributed) network environment. The machine may be a personal computer (PC), a tablet PC, a set-top box (STB), a Personal Digital Assistant (PDA), a cellular telephone, a web appliance, a server, a network router, switch or bridge, or any machine capable of executing a set of instructions (sequential or otherwise) that specify actions to be taken by that machine. Further, while only a single machine is illustrated, the term "machine" shall also be taken to include any collection of machines (e.g., computers) that individually or jointly execute a set (or multiple sets) of instructions to perform any one or more of the methodologies described herein.

The exemplary computer system 600 includes a processor 602, a main memory 604 (e.g., read-only memory (ROM), flash memory, dynamic random access memory (DRAM) such as synchronous DRAM (SDRAM) or Rambus DRAM (RDRAM), etc.), a static memory 606 (e.g., flash memory, static random access memory (SRAM), etc.), and a secondary memory 618 (e.g., a data storage device), which communicate with each other via a bus 630.

Processor 602 represents one or more general-purpose processing devices such as a microprocessor, central processing unit, or the like. More particularly, the processor 602 may be a complex instruction set computing (CISC) microprocessor, reduced instruction set computing (RISC) microprocessor, very long instruction word (VLIW) microprocessor, processor implementing other instruction sets, or processors implementing a combination of instruction sets. Processor 602 may also be one or more special-purpose processing devices such as an application specific integrated circuit (ASIC), a field programmable gate array (FPGA), a digital signal processor (DSP), network processor, or the like. Processor 602 is configured to execute the processing logic 626 for performing the operations described herein.

The computer system 600 may further include a network interface device 608. The computer system 600 also may include a video display unit 610 (e.g., a liquid crystal display (LCD), a light emitting diode display (LED), or a cathode ray tube (CRT)), an alphanumeric input device 612 (e.g., a keyboard), a cursor control device 614 (e.g., a mouse), and a signal generation device 616 (e.g., a speaker).

The secondary memory 618 may include a machine-accessible storage medium (or more specifically a computer-readable storage medium) 632 on which is stored one or more sets of instructions (e.g., software 622) embodying any one or more of the methodologies or functions described herein. The software 622 may also reside, completely or at least partially, within the main memory 604 and/or within the processor 602 during execution thereof by the computer system 600, the main memory 604 and the processor 602 also constituting machine-readable storage media. The software 622 may further be transmitted or received over a network 620 via the network interface device 608.

While the machine-accessible storage medium 632 is shown in an exemplary embodiment to be a single medium, the term "machine-readable storage medium" should be taken to include a single medium or multiple media (e.g., a centralized or distributed database, and/or associated caches and servers) that store the one or more sets of instructions. The term "machine-readable storage medium" shall also be taken to include any medium that is capable of storing or encoding a set of instructions for execution by the machine and that cause the machine to perform any one or more of the methodologies of the present disclosure. The term "machine-readable storage medium" shall accordingly be taken to include, but not be limited to, solid-state memories, and optical and magnetic media.

Thus, electrostatic chucks (ESCs) for plasma processing chambers, and methods of fabricating ESCs, have been disclosed.

What is claimed is:

1. A method of fabricating a substrate support assembly, the method comprising:
   forming a ceramic bottom plate having heater elements therein;
   forming a ceramic top plate having an electrode therein; and
   bonding the ceramic top plate to the ceramic bottom plate with a metal layer between the ceramic top plate and the ceramic bottom plate, the ceramic top plate in direct contact with the metal layer, and the metal layer in direct contact with the ceramic bottom plate, wherein bonding the ceramic top plate to the ceramic bottom plate with the metal layer comprises heating the ceramic bottom plate, the metal layer, and the ceramic top plate to a temperature less than 600 degrees Celsius.

2. The method of claim 1, wherein the metal layer is an aluminum foil, and the method comprises cleaning a surface of the aluminum foil to remove a passivation layer of the aluminum foil prior to bonding the ceramic top plate to the ceramic bottom plate with the metal layer.

3. The method of claim 1, further comprising:
   prior to bonding the ceramic top plate to the ceramic bottom plate with the metal layer, bonding a ceramic shaft to the ceramic bottom plate at a side of the ceramic bottom plate opposite the metal layer.

4. The substrate support assembly of claim 3, wherein bonding the ceramic shaft to the ceramic bottom plate comprises heating the ceramic shaft and the ceramic bottom plate to a temperature above 1400 degrees Celsius to form a diffusion bond between the ceramic shaft and the ceramic bottom plate.

5. The substrate support assembly of claim 3, wherein bonding the ceramic shaft to the ceramic bottom plate comprises coupling the ceramic shaft to the ceramic bottom plate by a second metal layer, the ceramic bottom plate in direct contact with the second metal layer, and the second metal layer in direct contact with the ceramic shaft.

* * * * *